(12) United States Patent
Lee

(10) Patent No.: US 9,052,446 B2
(45) Date of Patent: Jun. 9, 2015

(54) SELF-ALIGNED CHIP CARRIER AND PACKAGE STRUCTURE THEREOF

(71) Applicant: Industrial Technology Research Institute, Hsinchu (TW)

(72) Inventor: Wen-Chin Lee, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 137 days.

(21) Appl. No.: 13/907,984

(22) Filed: Jun. 3, 2013

(65) Prior Publication Data
US 2014/0286605 A1    Sep. 25, 2014

(30) Foreign Application Priority Data
Mar. 22, 2013   (TW) .............................. 102110276 A

(51) Int. Cl.
| G02B 6/42 | (2006.01) |
| G02B 6/12 | (2006.01) |
| H01L 23/48 | (2006.01) |

(52) U.S. Cl.
CPC ........ *G02B 6/12* (2013.01); *H01L 23/48* (2013.01); *H01L 2224/48091* (2013.01); *H01L 2924/10158* (2013.01); *H01L 2224/45144* (2013.01); *G02B 6/4214* (2013.01); *G02B 6/423* (2013.01); *G02B 6/4245* (2013.01)

(58) Field of Classification Search
None
See application file for complete search history.

(56) References Cited

U.S. PATENT DOCUMENTS

| 4,268,113 | A | 5/1981 | Noel, Jr. | |
| 6,052,500 | A | 4/2000 | Takano et al. | |
| 6,285,808 | B1 * | 9/2001 | Mehlhorn et al. | 385/14 |
| 6,985,645 | B2 * | 1/2006 | Cohen et al. | 385/14 |
| 7,329,054 | B1 | 2/2008 | Epitaux et al. | |
| 7,344,318 | B2 | 3/2008 | Lu et al. | |
| 7,433,554 | B2 * | 10/2008 | Warashina et al. | 385/14 |
| 7,539,366 | B1 * | 5/2009 | Baks et al. | 385/14 |
| 7,539,376 | B2 * | 5/2009 | Bozso et al. | 385/33 |
| 7,901,146 | B2 * | 3/2011 | Yoshikawa | 385/88 |
| 8,740,475 | B2 * | 6/2014 | Wu | 385/88 |
| 2001/0036337 | A1 * | 11/2001 | Kishida et al. | 385/49 |
| 2006/0097370 | A1 * | 5/2006 | Bartley et al. | 257/678 |
| 2007/0228548 | A1 * | 10/2007 | Kuang | 257/693 |
| 2008/0013959 | A1 * | 1/2008 | Ishigami | 398/135 |

(Continued)

FOREIGN PATENT DOCUMENTS

| JP | 2005037870 | 2/2005 |
| JP | 2005197689 | 7/2005 |
| JP | 2011039197 | 2/2011 |
| TW | 200942885 | 10/2009 |
| TW | 201140179 | 11/2011 |

OTHER PUBLICATIONS

Lim et al., "Demonstration of High Frequency Data Link on FR4 Printed Circuit Board Using Optical Waveguides", 57th Electronic Components and Technology Conference, Jun. 2007, p. 1268-p. 1274.

(Continued)

*Primary Examiner* — Mike Stahl
(74) *Attorney, Agent, or Firm* — Jianq Chyun IP Office

(57) ABSTRACT

The disclosure relates to a chip carrier, suitable for being inserted into a corresponding substrate. The light emitting/receiving chip mounted on the chip carrier is disposed within the corresponding substrate and aligned to the waveguide embedded in the corresponding substrate with an appropriate distance.

5 Claims, 6 Drawing Sheets

(56) References Cited

U.S. PATENT DOCUMENTS

2010/0061683 A1* 3/2010 Sasaki .................... 385/88
2011/0274392 A1* 11/2011 Miyatake ................. 385/33

OTHER PUBLICATIONS

Chan et al., "Organic optical waveguide fabrication in a manufacturing environment", 60th Electronic Components and Technology Conference, Jun. 2010, p. 2012-p. 2018.

Karppinen et al., "Parallel optical interconnect between ceramic BGA packages on FR4 board using embedded waveguides and passive optical alignments", 56th Electronic Components and Technology Conference, Jun. 2006, p. 799-p. 805.

Shibata et al., "Flexible Opto-Electronic Circuit Board for In-device Interconnection", 58th Electronic Components and Technology Conference, May 2008, p. 261-p. 267.

Uemura et al., "Hybrid Optical Interconnection Module with Built-in Electrical Power Line for Mobile Phone Using Highly-Flexible Integrally-Formed OE-FPC", 59th Electronic Components and Technology Conference, May 2009, p. 2101-p. 2105.

* cited by examiner

SELF-ALIGNED CHIP CARRIER AND PACKAGE STRUCTURE THEREOF

CROSS-REFERENCE TO RELATED APPLICATION

This application claims the priority benefit of Taiwan application serial no. 102110276, filed on Mar. 22, 2013. The entirety of the above-mentioned patent application is hereby incorporated by reference herein and made a part of this specification.

TECHNICAL FIELD

The disclosure relates to a carrier structure, and more particularly to a chip carrier capable of being self-aligned to the waveguide.

BACKGROUND

Currently, the common packaging approach is to flip or turn over the substrate mounted with the chip for packing up the light emitting chip as the inner projection light source of the circuit board. As the chip mounted substrate and the circuit board are usually connected through the ball grid array (BGA), numerous factors such as the height of the solder ball and the melting degree during the reflow process have to be well controlled. However, owing to the uncertainty, it is difficult to upgrade the alignment accuracy and the precision and reproducibility of the horizontal level of chip mounted substrate may be distressed, as well as the coupling accuracy of the laser light source and the optical waveguide within the circuit board.

Another approach of the light emitting chip package is to project the light into the circuit board through the substrate via(s) and the light emitting chip is guided through the via and emits the light to the optical waveguide However, as the distance is quite far away, high-performance lens is required to assist alignment.

The industry has a great demand in developing the packaging technology to pack the light emitting/receiving chip(s) into the circuit board.

SUMMARY

The embodiment of the disclosure provides a chip carrier. The chip carrier comprises a base portion and a connecting portion. The base portion has a first surface and a second surface opposite to the first surface and at least one first contact pad on the first surface. The connecting portion is located on the second surface of the base portion and has at least one second contact pad on a third surface of the connecting portion. The at least one first contact pad is electrically connected to the at least one second contact pad, the third surface is parallel to the second surface and the second surface has an area larger than that of the third surface.

The embodiment of the disclosure provides a package structure comprising a chip carrier and a substrate intended for the chip carrier. The chip carrier comprises a base portion, a connecting portion and at least one chip. The base portion has a first surface and a second surface opposite to the first surface and at least one first contact pad on the first surface. The connecting portion is located on the second surface of the base portion and has at least one second contact pad on a third surface of the connecting portion. The at least one first contact pad is electrically connected to the at least one second contact pad, the third surface is parallel to the second surface and the second surface has an area larger than that of the third surface. The at least one chip is located on the third surface of the connecting portion. The at least one chip is electrically connected to the connecting portion through the at least one second contact pad. In addition, the substrate has at least one slot for accommodating the chip carrier, and the at least one slot exposes at least a portion of an optical waveguide embedded in the substrate. When the chip carrier is inserted into the at least one slot of the substrate, the connecting portion and the at least one chip mounted thereon are buried in the at least one slot, and the third surface faces the optical waveguide. The at least one chip is self-aligned to the optical waveguide without directly touching the optical waveguide.

According to the embodiment(s) of the disclosure, the chip carrier may further comprise at least one middle portion disposed between the base portion and the connecting portion. An area of a connecting surface of the at least one middle portion and the connecting portion is larger or equivalent to an area of the third surface, and an area of a connecting surface of the at least one middle portion and the base portion is smaller or equivalent to an area of the second surface.

DESCRIPTION OF EMBODIMENTS

Figure 1A:
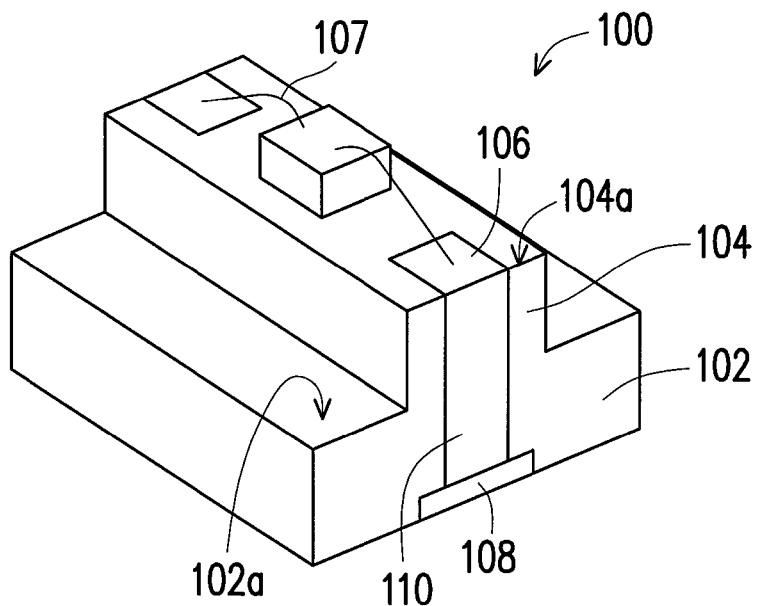
FIG. 1A illustrates a schematic three-dimensional view of a chip carrier according to an embodiment of the disclosure.

In the following description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure relates to a chip carrier. By way of the three-dimensional structural design of the carrier, the light emitting/receiving chip mounted on the carrier can self-align with the optical waveguide embedded in the corresponding substrate with the optimal distance.

Figure 1B:
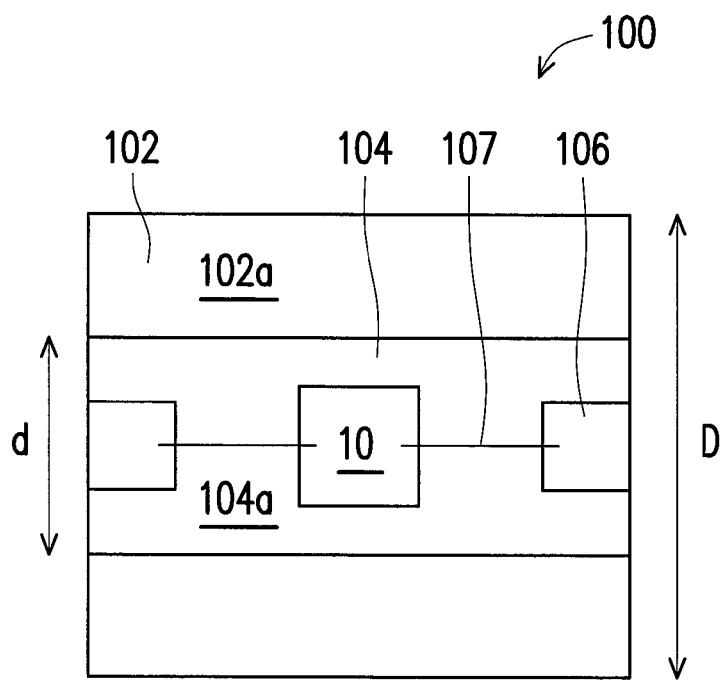
FIG. 1B illustrates a schematic top view of a chip carrier according to an embodiment of the disclosure.
Figure 1C:
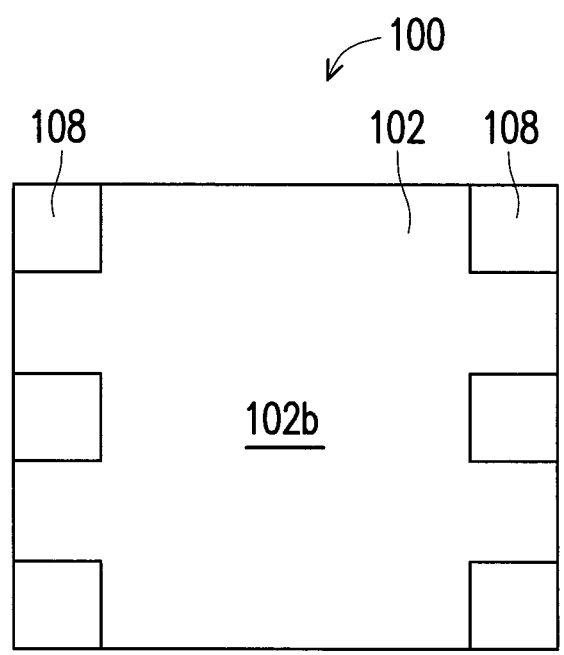
FIG. 1C illustrates a schematic bottom view of a chip carrier according to an embodiment of the disclosure.

FIG. 1A illustrates a schematic three-dimensional view of a chip carrier according to an embodiment of the disclosure. FIG. 1B illustrates a schematic top view of a chip carrier according to an embodiment of the disclosure. FIG. 1C illustrates a schematic bottom view of a chip carrier according to an embodiment of the disclosure. In this embodiment, the three-dimensional structural design is exemplified by the protrusion-type design, but the scope of this disclosure is not limited by the embodiment(s). The chip carrier 100 is designed in a form of a three-dimensional protrudent or convex plug structure. Taking the plug structure protruding upward as an example, the cross-section of the chip carrier 100 has an inverted T-shape. The chip carrier 100 has a base portion 102 and a connecting portion 104 located thereon. As shown in FIG. 1A, the base portion 102 is a square cuboid, while the connecting portion 104 located in the center of the base portion 102 is a rectangular cuboid. Because the width of the connecting portion 104 is narrower than that of the base portion 102 and the connecting portion 104 is protruded from the base portion 102, the connecting portion 104 functions as the insertion portion of the plug structure. In general, the chip 10 is mounted on the insertion portion, so that the chip 10 will be aligned with the optical waveguide embedded in the corresponding substrate when the chip carrier 100 is inlaid in the corresponding substrate and the chip 10 on the chip carrier 100 is inserted into the corresponding substrate. The chip 10 may be a laser chip, a light emitting diode (LED) chip, a light-emitting chip or a light sensing chip, for example.

In addition, the chip carrier 100 can be fabricated with materials of high thermal conductivity and/or materials suitable for high frequency. The materials of high thermal conductivity may employ common substrate materials with excellent thermal conductive properties, and the materials of high thermal conductivity may be ceramic, mixed resins containing ceramic powders, high thermal conductivity resins (high thermal conductivity resins, for example, having the thermal conductivity greater than 0.5 W/mK), alumina ($Al_2O_3$), aluminum nitride (AlN) or the like. In the present embodiment, the thermal conductivity of the high thermal conductivity material, for example, is greater than 0.5 W/mK and substantially higher than the thermal conductivity of the material of the optical waveguide. The materials suitable for high frequency transmission (i.e. high-frequency materials) may be the materials having low high-frequency signal loss. The so-called material having low high-frequency signal loss is the material that is capable of transmitting at least 1.5 GHz high-frequency signals without distortion (i.e. the material met the eye diagram of more than 1.5 GHz). For example, the high-frequency materials may be ceramic, mixed resins containing ceramic powders, a fluorine-containing resin material or resins with the dielectric constant of less than 3.5.

The chip carrier 100 using high-frequency material(s) can help the chip to receive high-frequency signals. The chip carrier 100 using high thermal conductivity material(s) can enhance uniform heat dissipation of the chip to the outer circuit board.

Referring to FIG. 1B, the connecting portion 104 of the chip carrier 100 is located on the upper surface 102a of the base portion 102, and the connecting portion 104 having a plurality of contact pads 106 (e.g., bonding pads) (there are two pads shown in FIG. 1B, but the number of the pads may be varied depending on the chip design). The chip 10 is mounted on the top surface 104a of the connecting portion 104 and the chip 10 is connected to the pads 106 located on the upper surface 104a through the wires (such as gold wires 107) welded to the pads 106. In other embodiments, the wires 107 may be silver or copper wires. Although the chip 10 is electrically connected to the pad(s) 106 of the chip carrier 100 through wire-bonding, the chip carrier 100 and the chip 10 carried thereon may be electrically connected by flip-chip technology.

Referring to FIG. 1C, the bottom surface 102b of the base portion 102 is set with an array of contact pads 108 (there are six pads shown in FIG. 1C, but the number of the pads may be varied depending on the chip design), the contact pads 108 are electrically connected to the bonding pads 106 through the conductive wires 110 (or the through-hole vias). As seen from FIG. 1B, the width d of the connecting portion 104 is less than the width D of the base portion 102. The top surface 104a of the connection portion 104 has an area less than the area of the bottom surface 102b of the base portion 102. That is, the top surface 104a is the narrow surface of the chip carrier 100 and the bottom surface 102b is the wide surface of the chip carrier 100. Taking this embodiment as an example, the "bottom" surface 102b is based on the convex plug protruded upward. However, when the chip carrier 100 is inlaid in the corresponding substrate, the wide surface 102b becomes the top surface and the narrow surface 104a becomes the lower surface facing downward toward the optical waveguide.

For example, the area of the top surface 104a is smaller than the area of the bottom surface 102b. The area of the surface 104a (narrow surface) or the area of the bottom surface 102b (width surface) ranges between about 2500 $\mu m^2$ to 100 $cm^2$. In general, the area of the surface ranges between about 60000 $\mu m^2$ to 1 $cm^2$. The area ratio of the wide and narrow surfaces is about 5:2, but other ratios may be used.

When the chip carrier 100 is applied to the circuit board package, the contact pads 108 on the bottom surface 102b (width side) of the chip carrier 100 may be electrically connected to the other circuitry (such as the driving circuit) of the circuit board through the gold wire or other connecting means. In one embodiment, the chip carrier 100 may match with the corresponding structure (e.g. concavity) of the circuit board and the bottom surface 102b (wide surface) of the chip carrier 100 may be inlaid in the circuit board.

Figure 2A:
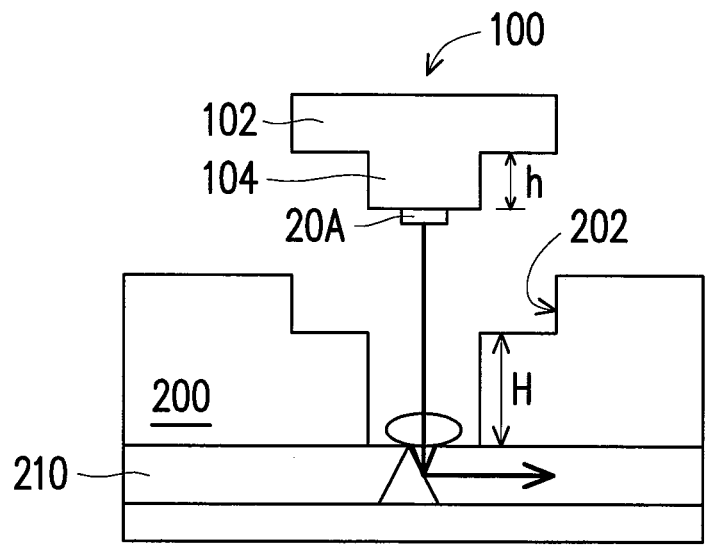
FIG. 2A illustrates the chip carrier mounted with the laser chip to be inserted into the substrate with the embedded optical waveguide.
Figure 2B:
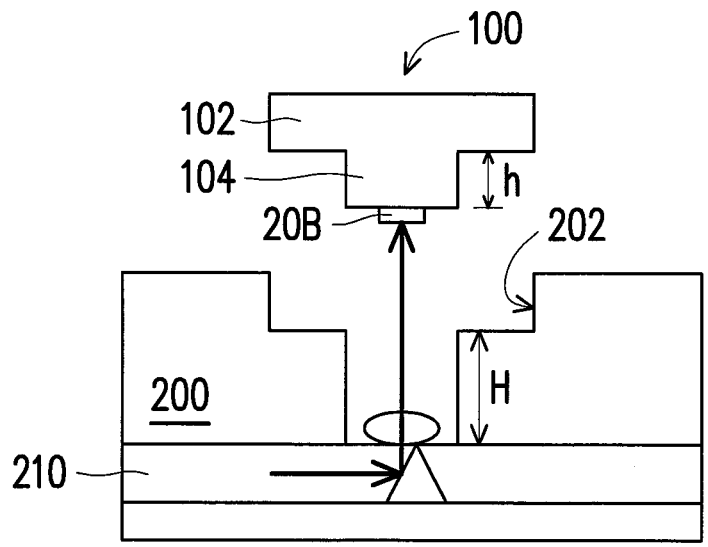
FIG. 2B illustrates the chip carrier mounted with the light sensing chip to be inserted into the substrate with the embedded optical waveguide.

FIG. 2A illustrates the chip carrier mounted with the laser chip to be inserted into the substrate with the embedded optical waveguide. FIG. 2B illustrates the chip carrier mounted with the light sensing chip to be inserted into the substrate with the embedded optical waveguide. As shown in FIG. 2A, the protrudent-type T-shaped chip carrier 100 with the laser chip 20A is fitted into the empty slot 202 (with a shape complementary to the T-shaped plug) of the circuit board 200. Before inserting the chip carrier 100, the empty slot 202 of the substrate/circuit board 200 exposes at least a portion of the buried optical waveguide 210. The depth H of the empty slots 202 may be designed to be slightly larger than the height h of the connecting portion 104, so that the chip 20A is self-aligned (but not in direct contact) with the optical waveguide 210 of the circuit board 200 at the most suitable distance. The laser beams (represented by arrows) of the laser chip 20A project to the desired position of the circuit board through the optical waveguide 210.

As shown in FIG. 2B, the protrudent-type T-shaped chip carrier 100 with the light sensing chip 20B is fitted into the empty slot 202 (with a shape complementary to the T-shaped plug) of the circuit board 200. Before inserting the chip carrier 100, the empty slot 202 of the substrate/circuit board 200 exposes at least a portion of the buried optical waveguide 210. The depth H of the empty slots 202 may be designed to be slightly larger than the height h of the connecting portion 104, so that the light sensing chip 20B is self-aligned (but not in direct contact) with the optical waveguide 210 of the circuit board 200 at the most suitable distance. The light sensing chip 20B receives the light (represented by arrows) transmitted through the optical waveguide 210 of the circuit board 200.

In one embodiment, the empty slot 202 has a shape complementary to the shape of the protrudent-type chip carrier 100, so as to guide the chip carrier 100 and achieve self-alignment. And the empty slots 202 is designed to has a depth deeper than the height of the connecting portion 104 of the chip carrier 100, so that the chip 20A/20B is not in direct contact with the optical waveguide 210, but the chip 20A/20B is self-aligned to the optical waveguide 210 of the circuit board 200 at the appropriate distance.

Figure 2C:
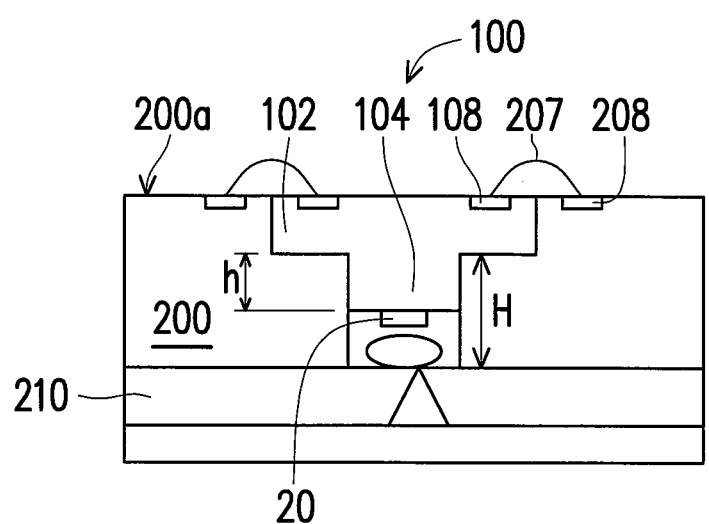
FIG. 2C is a schematic cross-sectional view of the package structure having the chip carrier mounted with the chip being inlaid in the substrate with the embedded optical waveguide.

FIG. 2C is a schematic cross-sectional view of the package structure having the chip carrier mounted with the chip being inlaid in the substrate with the embedded optical waveguide. The narrow surface 104a of the chip carrier 100 faces downward and is inlaid into the empty slots 202 of the substrate 200 with the embedded optical waveguide 210. As the empty slot 202 has a shape complementary to the shape of the protrudent-type chip carrier 100, the chip carrier 100 is guided and self-alignment is achieved. In one embodiment, when the chip carrier 100 is fitted to the substrate 200 (for example, a circuit board), the bottom surface 102b (wide surface) of the chip carrier 100 is coplanar with the upper surface 200a of the substrate 200. In another embodiment, when the chip carrier 100 is fitted to the substrate 200 (e.g. a circuit board), the upper surface 200a of the substrate 200 may be coplanar with or located at a different level of the bottom surface 102b of the chip carrier 100. As long as the bottom surface 102b may be connected to the upper surface 200a of the substrate 200 via wires or other means, slight height differences are allowed between the bottom surface 102b and the upper surface 200a. In addition, in the present embodiment, the upper surface 104a and the bottom surface 102b may be parallel to each other. However, relative to the upper surface 104a, the bottom surface 102b may be designed to be a slightly curved or inclined surface and is not parallel to the upper surface 104a.

Because the connection portion 104 and the chip 20 carried thereon are buried in the empty slot 202, the chip 20 located within the empty slot can self-aligned to the optical waveguide 210 embedded in the substrate 200. Since the depth H of the empty slots 202 is slightly larger than the height h of the connecting portion 104, the chip 20 may automatically align with the optical waveguide 210 of the circuit board 200 at a suitable distance, but does not directly contact with the optical waveguide 210. The contact pads 108 on the wide surface 102b of the chip carrier 100 may be electrically connected to the contact pads 208 of the corresponding circuit board via gold wires 207 (or other means), so as to be electrically connected to other circuits (such as a driving circuit) of the substrate.

In one embodiment, the circuit board or substrate has at least one corresponding recess or slot to guide the chip to be inserted to the proper position and self-aligned to the optical waveguide embedded in the substrate. By doing so, the lens may be omitted, poor alignment can be avoided and the higher successful rate of the optical alignment is achieved.

Also, if the chip carrier is fabricate by using the high thermal conductivity materials and/or high frequency materials, it can help the chip to receive high-frequency signals and to assist dissipation of the heat generated by the chip evenly to the outer layer of the circuit board.

Figure 3:
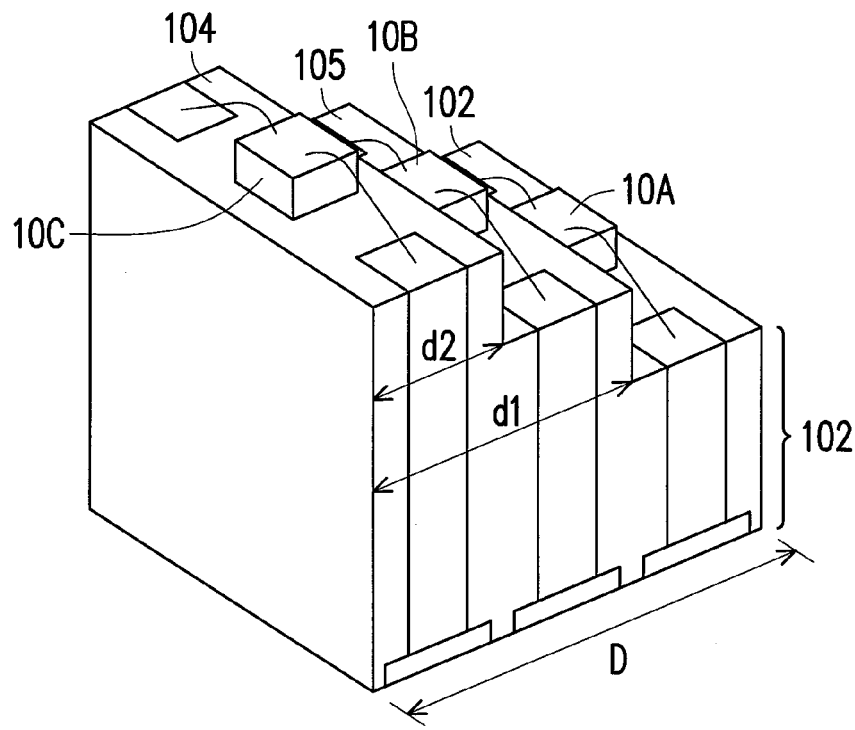
FIG. 3-5 illustrates three structures of the chip carrier according to another embodiment of the disclosure.
Figure 4:
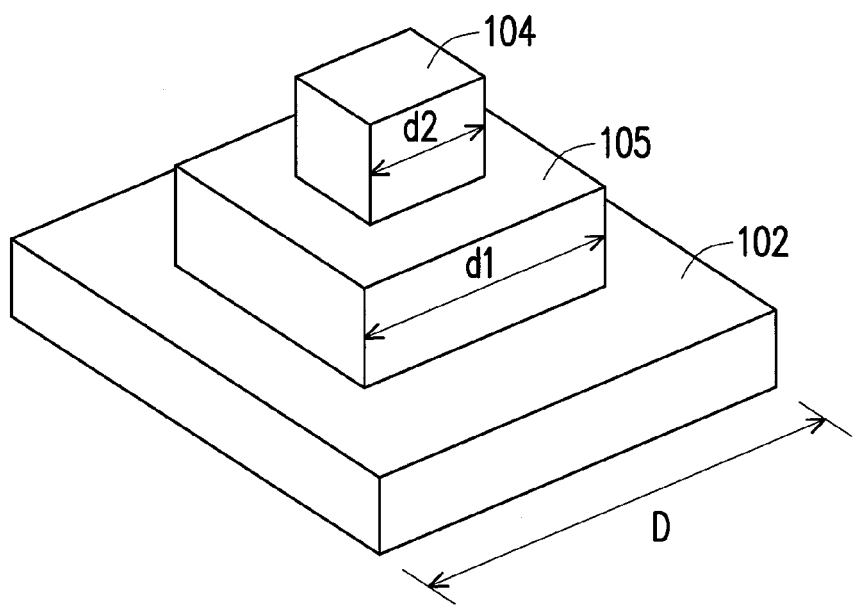
Figure 5:
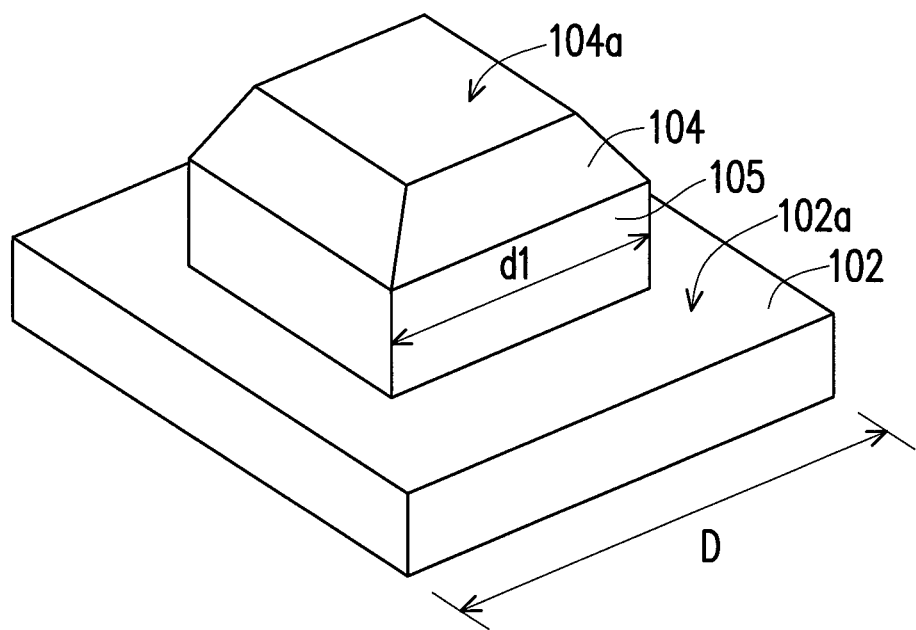

FIG. 3-5 illustrates three structures of the chip carrier according to another embodiment of this disclosure. As shown in FIG. 3, the chip carrier 100 is designed to be a multi-level, stepped protrudent-type plug, and the cross-sectional view of the chip carrier 100 is similar to the shape of three-stairs. The chip carrier 100 has a base portion 102, a middle portion 105 located on the base portion 102 and a connecting portion 104 located on the middle portion 105. As shown in FIG. 3, the base portion 102 is a rectangular cuboid with a width D, and the middle portion 105 is a rectangular cuboid with a width d1 located at one side of the base portion 102 and aligned with three sides of the base portion 102. The connecting portion 104 is a rectangular cuboid having a width d2 located at one side of the middle portion 105 and aligned with three sides of the middle portion 105. Three sides of the base portion 102 align with the three sides of the middle portion 105 and the connecting portion 104. The width d2 of the connecting portion 104 is smaller than the width d1 of the middle portion 105, and both widths d2 and d1 are less than the width D of the base portion 102. Depending on the shape design of the slot or opening of the substrate, the chip carrier 100 shown in FIG. 3 can employ the middle portion 105 and the connecting portion 104 as the insertion portion of the plug. Alternatively, the chip carrier 100 can employ the middle portion 105, the connecting portion 104 and the base portion 102 as the insertion portion of the plug, and the chips 10A, 10B, 10C are respectively located on the base portion 102, the middle portion 105 and the connecting portion 104. In addition, the chips 10A, 10B and 10C may be electrically connected to the chip carrier through wires.

As shown in FIG. 4, the chip carrier 100 is designed to be a three-level, stepped protrudent-type plug. The chip carrier 100 has a base portion 102, a middle portion 105 located on and in the center of the base portion 102 and a connecting portion 104 located on and in the center of the middle portion 105. As shown in FIG. 4, the base portion 102 is a square cuboid with a size D, the middle portion 105 is a square cuboid with a size d1 and the connecting portion 104 is a square cuboid having a size d2. The size d2 of the connecting portion 104 is smaller than the size d1 of the middle portion 105, both sizes d2 and d1 are less than the size D of the base portion 102. Depending on the shape design of the slot or opening of the substrate, the chip carrier 100 shown in FIG. 4 can employ the middle portion 105 and the connecting portion 104 as the insertion portion of the plug. Alternatively, the chip carrier 100 can employ the middle portion 105, the connecting portion 104 and the base portion 102 as the insertion portion of the plug.

In FIG. 5, the chip carrier 100 is designed to be a three-level protrudent-type plug. The chip carrier 100 has a base portion 102, a middle portion 105 located on and in the center of the base portion 102 and a connecting portion 104 located on the middle portion 105. As shown in FIG. 5, the base portion 102 is a square cuboid with a size D, the middle portion 105 is a square cuboid with a size d1 and the connecting portion 104 is a square frustum with a narrower top surface 104a (narrow surface) and a wider bottom surface. The edges of the bottom surface of the connecting portion 104 are aligned with the edges of the joining top surface of the middle portion 105 (i.e. the same surface area). The size d1 of the middle portion 105 is less than the size D of the base portion 102. The chip carrier 100 of FIG. 5 employs the middle portion 105 and the connecting portion 104 as the insertion portion of the plug. As shown in FIG. 5, the joining surface area of the middle portion 105 and the connecting portion 104 is larger than that of the narrow surface 104a of the connecting portion 104, while the joining surface area of the middle portion 105 and the base portion 102 is smaller than (or equivalent to) the wide bottom surface 102a of the base portion 102.

The chip carrier of the present disclosure is designed to have at least a base portion and a connecting portion, and further may have a multi-level design. Taking FIG. 5 as an example, the design refers to a three-tiered structure, but the structure of the chip carrier of course is not limited to the embodiments shown herein and may be structures of two-, three-, four-tiers or of more tiers. The structure of multi-tiered frustums may shape like a pyramid, including two or more planes parallel to each other, and the surface area of the parallel planes decreases from bottom to top. The shape and the level spacing can be modified to assist the self-alignment to the optical waveguide.

The shape or size of the multi-tiered structure is not limited to the examples described above and may be liberally modified. For example, a cylinder or conical frustum base portion with at least a triangular prism or triangular pyramid or a pentagonal base portion with at least a cylinder or conical frustum. The relative configuration of the portions or tiers is not limited to a central location or the marginal location and modification or adjustment may be made according to the design of the corresponding circuit board or substrate.

The chip carrier 100 of the present disclosure is designed to have the protruded portion (e.g. the connecting portion and/or the middle portion) integrally formed or individually formed with the base portion, for example, and either portion may be manufactured of the same material or different materials.

Further, in the present embodiment, the protruded portion of the chip carrier with the chip mounted thereon may help dissipate or directly transfer the heat generated by the chip to the circuit board or the outer environment, which improves the overall thermal efficiency of the package.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims and their equivalents.

What is claimed is:

1. A package structure, comprising:
a chip carrier, wherein the chip carrier comprises:
a base portion, having a first surface and a second surface opposite to the first surface and having at least one first contact pad on the first surface;
a connecting portion, located on the second surface of the base portion and having at least one second contact pad on a third surface of the connecting portion, wherein the at least one first contact pad is electrically connected to the at least one second contact pad, the third surface is parallel to the second surface and the second surface has an area larger than that of the third surface; and
at least one chip, located on the third surface of the connecting portion, wherein the at least one chip is electrically connected to the connecting portion through the at least one second contact pad; and
a substrate, having at least one slot for accommodating the chip carrier, wherein the at least one slot exposes at least a portion of an optical waveguide embedded in the substrate, and
wherein the chip carrier is inserted into the at least one slot of the substrate, the connecting portion and the at least one chip mounted thereon are buried in the at least one slot, and the third surface faces the optical waveguide, the at least one chip is self-aligned to the optical waveguide without touching the optical waveguide.

2. The package structure according to claim 1, further comprising at least one middle portion disposed between the base portion and the connecting portion, wherein an area of a connecting surface of the at least one middle portion and the connecting portion is larger than or equivalent to an area of the third surface, and an area of a connecting surface of the at least one middle portion and the base portion is smaller or equivalent to an area of the second surface.

3. The package structure according to claim 1, wherein a material of the connecting portion and the base portion is a high thermal conductivity material or a high-frequency material.

4. The package structure according to claim 3, wherein the high thermal conductivity material has a thermal conductivity larger than that of a material of the optical waveguide.

5. The package structure according to claim 1, wherein the at least one chip is a laser chip, a light emitting diode chip, a light emitting chip or a light sensing chip.

* * * * *